United States Patent [19]

Wang et al.

[11] Patent Number: 4,878,028
[45] Date of Patent: Oct. 31, 1989

[54] TECHNIQUE FOR GENERATING PRECOMPENSATION DELAY FOR WRITING DATA TO DISKS

[75] Inventors: Yun-Che Wang, Saratoga; Paul H. Scott, San Jose, both of Calif.

[73] Assignee: Advanced Micro Devices, Inc., Sunnyvale, Calif.

[21] Appl. No.: 13,846

[22] Filed: Feb. 12, 1987

[51] Int. Cl.⁴ .................. H03K 5/159; H03K 5/13; H03K 3/01

[52] U.S. Cl. .................. 328/55; 328/66; 328/155; 307/591; 307/595; 307/602; 307/603; 307/605; 307/606

[58] Field of Search ............ 307/590, 591, 593, 595, 307/602, 603, 605, 606, 608; 328/55, 66, 133, 156, 158, 155

[56] References Cited

U.S. PATENT DOCUMENTS 4,565,976  1/1986  Campbell ................. 331/57
4,608,543  8/1986  Adams .................... 331/8

FOREIGN PATENT DOCUMENTS 0160567 11/1985 European Pat. Off. .

OTHER PUBLICATIONS

Stout et al., "Winchester Electronic Functions Fit on Four High Speed Clips" Electronics, Jun. 16, 1982, pp. 117-123.
Szejnwald, "Simplify Hard-Disk Interfaces with a VLSI Controller", EDN, Nov. 24, 1982, pp. 133-147.
AM9581 Advanced Information, printed in Advanced Micro Devices, "MOS Microprocessors and Peripherals Data Book," 1985, pp. 2-561 to 2-577.

Primary Examiner—Stanely D. Miller
Assistant Examiner—Trong Quang Phan
Attorney, Agent, or Firm—Fleisler, Dubb, Meyer & Lovejoy

[57] ABSTRACT

Apparatus is disclosed for introducing a precompensation delay in the path of a data signal to be written onto a magnetic medium, such as a floppy or hard disk. The apparatus includes a current controlled oscillator made up of delay elements having current control nodes, and means for controlling the current level being drawn from the current control nodes. The latter means includes three matched voltage controlled current sources having their outputs connected through a current splitter to the current control nodes, and bypass transistors for decoupling two of the voltage controlled current sources in response to a delay selection signal indicating whether the subject data pulse should be precompensated early, nominal or late. A current mirror arrangement with a current transfer ratio adjustable through the choice of two external resistors adjusts the current outputs of two of the voltage controlled current sources, so that the current level drawn from the current control nodes is different depending on which the voltage controlled current sources is (are) selected. The apparatus also includes a master voltage controlled oscillator, located on the same chip as the above-described apparatus, with characteristics and a control voltage matched to those of the above-described apparatus. If the frequency of the master oscillator is phase locked to a multiple of the bit cell frequency, then the choice of the two external resistors adjusts the precompensation delay period as a continuous percentage of the bit cell time.

17 Claims, 4 Drawing Sheets

TECHNIQUE FOR GENERATING PRECOMPENSATION DELAY FOR WRITING DATA TO DISKS

BACKGROUND

1. Field of the Invention

The invention relates to integrated circuitry for writing data to a magnetic medium, and more particularly to techniques for generating a precompensation delay in the path of the data stream.

2. Description of Related Art

Data is recorded on magnetic media, such as floppy disks and hard disks, in the form of present or absent flux reversals. These flux reversals have a minimum linear separation which is dependent upon the data rate, the encoding format and the speed with which the medium moves past the write head.

The pattern of flux reversals is generated from an incoming data stream by an encoder, which may use any of several standard encoding formats to generate the pattern. Two popular encoding formats are known as FM and MFM, each of which generate an outgoing pulse stream divided into bit cells consisting of a clock pulse and/or a data pulse for each bit of the incoming data stream. As used herein, a pulse stream is merely one type of data stream. In FM encoding, a bit cell always begins with a clock pulse. If the incoming data bit is a 1, a data pulse is also inserted in the middle of the bit cell. If the data bit is 0, no data pulse is inserted. For FM encoding, therefore, a clock pulse and a data pulse can both be present within the bit cell. Since each pulse causes a flux reversal on the disk, the minimum linear separation between flux reversals is one-half the bit cell length.

In MFM encoding, like FM encoding, a data pulse is inserted in the middle of the bit cell if and only if the incoming data bit is 1. Unlike FM encoding, however, a clock pulse is inserted at the beginning of a bit cell if and only if both the present and previous incoming data bits are 0. The minimum linear separation between flux reversals for MFM encoding therefore is one full bit cell length. Because of this, MFM-encoded data is usually given twice the bit cell density and data rate as FM-encoded data recorded on the same medium.

A double density floppy disk typically operates at a data rate of 500 kbits/sec with MFM-encoded data, and has a bit cell time of 2µS. A hard disk may operate at about 5 Mbits/sec, yielding a bit cell time of 200nS.

For higher bit density media, nearby flux changes may interact with each other and cause them to move farther apart. This creates a timing uncertainty which can cause errors when data is read. To overcome this problem, the outgoing data stream may be precompensated before being written. That is, the direction of each shift may be anticipated and the pulse in the outgoing data stream moved in the other direction before being sent to the write head. Typical precompensation periods in present use are 2-20nS for hard disks and 50-150nS for 5-¼" floppy disks.

In the past, precompensation was typically accomplished by feeding the outgoing pulse stream into a fixed, center-tapped delay line external to the chip which performed the encoding. a data selector was then used to select the signal from either the input, center tap, or output of the delay line, depending on whether the pulse was to be written early, nominal or late, respectively. This technique is described, for example, in Szejnwald, "Simplify Hard-Disk Interfaces With a VLSI Controller," EDN, Nov. 24, 1982, pp. 133–147, at 136–138, with respect to the NEC µPD7261. The technique is disadvantageous, however, because it requires the designer to know in advance exactly what precompensation delay period will be used in terms of an absolute number of nanoseconds. It does not permit easy electronic adjustment of the precompensation delay period. For example, bit shifting is more serious on inner tracks of a disk than on outer tracks because the flux reversals are closer together. The NEC technique does not permit easy adjustment of the delay period to compensate for this as the write head changes tracks on the disk. Nor can the NEC technique be used with constant density recording, which requires the delay period to change dynamically as a function of the bit rate.

In Stout, "Winchester Electronic Functions Fit on Four High-Speed Chips," Electronics, June 16, 1982, pp. 117–123, at 122, there is described a National Semiconductor chip which generates a precompensation delay internally, with a period which is externally programmable for 0 to 20nS in 2nS steps. External programmability alleviates some problems with the NEC chip, but the delay period is still specified in terms of an absolute number of nanoseconds which does not change as a function of the bit rate. The National technique also requires many I/0 pins to implement and requires the use of an external reference frequency source. The method by which the delay is actually generated is not disclosed.

SUMMARY OF THE INVENTION

It is therefore an object of the present invention to propose a technique for generating precompensation delay which is not subject to the above disadvantages.

It is another object of the present invention to provide apparatus for generating a precompensation delay in the path of a data signal, the delay having a duration which is an adjustable percentage of the bit cell time.

It is another object of the present invention to provide a circuit which can be used to delay a data signal by an adjustable amount.

It is another object of the present invention to provide a circuit which may be used to generate a precompensation delay having a duration which is adjustable through the choice of inexpensive, accurate external components.

The above objects and other are accomplished according to the invention by providing a master oscillator having a period of oscillation responsive to an analog signal, and a variable delay generator generating a delay in the path of the data signal, the delay period being responsive to the same analog signal. The variable delay generator may include an oscillator like the master oscillator, and may be constructed on the same chip to permit matching of component characteristics. If the oscillators are current controlled oscillators, then the analog signal which controls the master oscillator may be transmitted to the variable delay generator oscillator through a current mirror having a current transfer ratio which is adjustable externally.

BRIEF DESCRIPTION OF THE DRAWINGS

The invention will be described with respect to specific embodiments thereof, and reference will be made to the drawings, in which.

DETAILED DESCRIPTION

Figure 1:
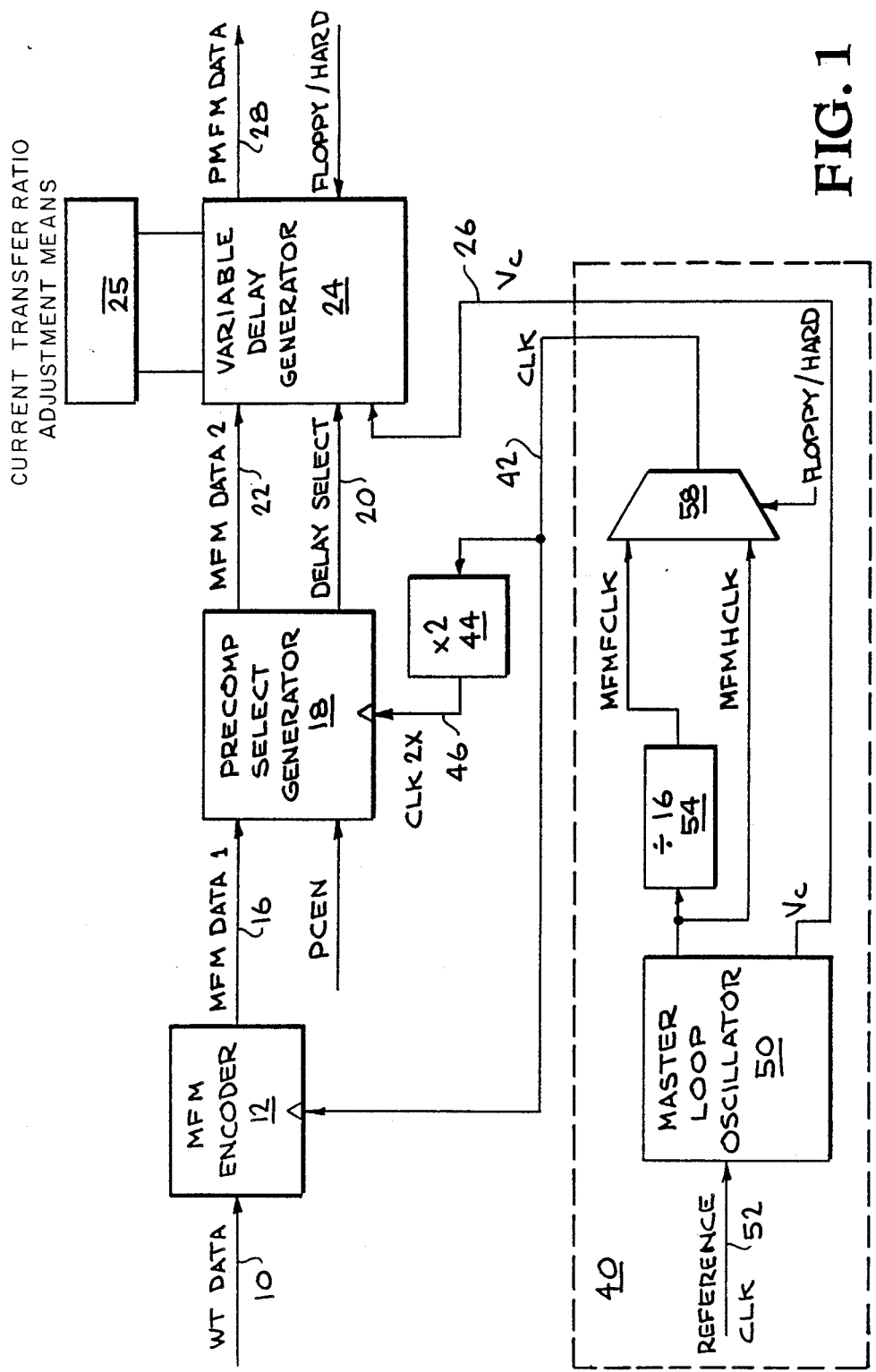
FIG. 1 shows a block diagram of a part of an integrated circuit chip incorporating the invention.

In FIG. 1 there is shown a block diagram of apparatus which incorporates features of the invention. The apparatus of FIG. 1 is included in the Am9582 Disk Data Separator, which further includes other portions not shown, such as logic for reading and decoding data from the disk.

Data to be written to either a floppy or hard disk enters the apparatus of FIG. 1 along a WT Data line 10 and is fed to an MFM encoder 12. The MFM encoder 12 converts the WT Data signal into the MFM format, and sends the MFM data along an MFMdata-1 line 16 to a Precompensation Select Generator 18. The Precompensation Select Generator 18 generates a Delay Selection signal 20 which indicates whether the pulse next to emerge from the Precompensation Select Generator 18 along the MFMdata-2 line 22 is to be written early, nominal or late. The Delay Selection Signal 20 consists of three separate signals not shown separately in FIG. 1, designated Early, Nominal0 and Late The Precompensation Select Generator 18 also has a PCEN input for enabling precompensation. If PCEN is 0, the Delay Selection signal 20 always indicates Nominal delay. MFMdata2 line 22 and Delay Selection line 20 are fed to a Variable Delay Generator 24, which also takes as inputs a voltage signal $V_c$ and an indication of whether the apparatus is being operated with a floppy or hard disk drive. The Variable Delay Generator 24 also has connected to it a current transfer ratio adjustment means 25, which is external to the chip, the function of which will be described below. The output of the Variable Delay Generator 24 is the precompensated MFM data signal, which appears along a PMFM Data line 28. The PMFM data line 28 is output to a floppy or hard disk interface (not shown).

The apparatus further includes a Bit Rate Oscillator 40, which generates as outputs a Clk clock signal 42 and the previously mentioned $V_c$ voltage indication. The Clk signal 42 is essentially a square wave operating at a frequency equal to the bit rate of the WT Data signal on line 10. The Clk signal, in additional to being connected to many clock inputs of many functional blocks not shown, is connected to a clock input of the MFM encoder 12. It is also connected to a frequency doubler 44, which generates a pulse on a Clk2x output 46 for every rising and falling edge of Clk. The Clk2x line 46 is connected to the clock input of Precompensation Select Generator 18.

The Bit Rate Oscillator 40 consists of a Master Loop Oscillator 50, to be described further below, which generates a MFMHClk square wave signal and the $V_c$ signal mentioned previously. The $V_c$ signal is an analog indication of the frequency of operation of the Master Loop Oscillator 50. As will be further described below, MFMHClk is phase locked to a reference clock signal 52, which may be generated by a crystal controlled oscillator or another reference oscillator (not shown). Components of the reference oscillator are located off-chip, so that the frequency of the reference clock signal 52 (and thereby the MFMHClk signal and the frequency of chip operation) may be precisely controlled as desired. The MFMHClk signal is connected to the input of a divide-by-16 counter 54, which outputs an MFMFClk signal, essentially a square wave. The MFMHClk signal operates on the order of 4 to 16 MHz, and corresponds to the bit rate useful for recording MFM-encoded data on a hard disk. The MFMFClk signal operates at about 250 to 1,000 kHz and corresponds to the bit rate useful for recording MFM-encoded data on a floppy disk. The MFMHClk, and MFMFClk signals are connected to the two inputs of a data selector 58, which selects one of the two square wave signals in response to a Floppy/Hard signal for output onto the Clk line.

As can be seen, the apparatus in FIG. 1 may be used for writing data to either a floppy disk or a hard disk in MFM format. In operation, the selection is made externally and generally remains constant for at least the time period required to write a string of data to the disk. The Bit Rate Oscillator 40 generates the system Clk signal in response to both that selection and the previously mentioned reference oscillator. As data enters the circuit of FIG. 1 on the WT Data line 10, it is encoded into the MFM data format at the rate determined by Clk.

At the same time, the MFM-encoded output of MFM encoder 12 is fed to the Precompensation Select Generator 18, which generates the Delay Selection signal 20 to indicate whether precompensation for the pulse next to emerge from the Precompensation Select Generator 18 should be written Early, Nominal or Late. Each bit cell in MFM-encoded data can have a pulse at either the beginning or middle of the bit cell time, or both, and each such pulse position must be precompensated separately. The Precompensation Select Generator 18 therefore treats the incoming pulse stream as a series of independent data positions occurring at twice the frequency of the bit cell time as indicated by Clk. As will be further described below, the pulse stream emerging from Precompensation Select Generator 18 along the MFMdata-2 line 22 is delayed from the incoming pulse stream by six Clk2x periods (three Clk periods) and the Delay Selection signal 20 emerges one Clk2x period earlier. If PCEN is 0, the Delay Selection signal 20 always indicates nominal delay.

The MFMdata-2 signal 22 and the Delay Selection signal 20 are fed to the Variable Delay Generator 24. The Variable Delay Generator 24 inserts a delay in the path of MFMdata-2 signal 22 which is equal to zero times a unit delay period for Early precompensation, one unit delay period for Nominal precompensation, or two unit delay periods for Late precompensation. A basic additional delay of half the bit cell time is also inserted by the electronics in Variable Delay Generator 24 regardless of the state of Delay Selection signal 20. This basic delay does not affect device operation because the position of the flux reversals on the disk is relevant only in relation to each other, not in relation to some absolute position on the disk. The same is true with respect to the delay of three Clk periods inserted by Precompensation Select Generator 18 as described above.

As will be described below, the unit delay period is externally adjustable according to the ratio of two external resistors from 1% to 20% of the bit cell time with an accuracy of ±5% of the chosen value or 1nS, whichever is greater using 1% resistors. The minimum delay period that can be set is 2nS. Once this percentage is set by the choice of the external resistors, it remains a constant percentage independent of changes in the bit cell time caused by either a change in the reference clock frequency or the choice of floppy or hard disk drive. This permits the data rate to be changed in real time, and the precompensation periods changed correspondingly, merely by changing the frequency of the reference clock signal. It will be understood that, instead of generating only early, nominal and late delay selection signals, the Precompensation Select Generator 18 and the Variable Delay Generator 24 may be adapted to handle other schemes of precompensation such as early, half-early, nominal, half-late and late. It will also be understood that the Variable Delay Generator 24 may, instead of generating 0, 1 or 2 unit delay periods in the path of the pulse stream, generate −1, 0 or 1 delay period. That is, "early" precompensation may be generated by advancing the emergence of a pulse from the output of Variable Delay Generator 24 over the basic delay normally inserted by the electronics in the Variable Delay Generator 24. Other variations will be apparent. The precompensated signal emerging from the Variable Delay Generator 24 is fed to the disk drive interface.

Figure 2:
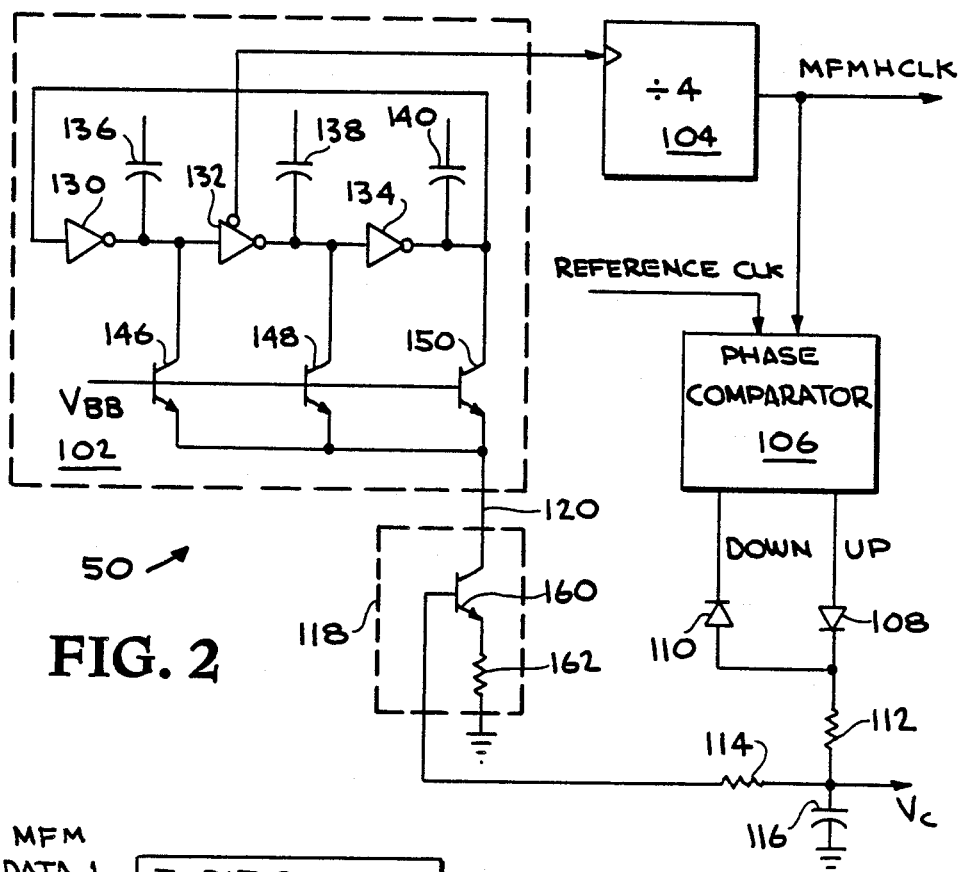
FIG. 2 shows a detail of the Master Loop Oscillator shown in FIG. 1.

The master loop oscillator 50 in FIG. 1 is shown in greater detail in FIG. 2. It is essentially a phase locked loop, comprising a current controlled oscillator (CCO) 102 having an output connected to the clock input of a divide-by-four counter 104, the output of which is connected to one input of a phase comparator 106, the other input of the phase comparator 106 being connected to the reference clock input, the phase comparator 106 having pump-up and pump-down outputs connected through diodes 108 and 110, respectively, to a first end of a resistor 112, the second end of resistor 112 being connected through a filter capacitor 116 to ground, the second end of resistor 112 being further connected through a resistor 114 to the voltage control input of a voltage controlled current source 118, the current output of which is connected to the current control node 120 of the CCO 102. The MFMHClk signal shown in FIG. 1 is taken from the output of the divide-by-four counter 104, and the $V_c$ signal is taken from the junction between resistor 112 and capacitor 116.

The CCO 102 consists of three inverters 130, 132 and 134 connected in sequence, with the output of inverter 134 looping around to connect to the input of inverter 130. The output of inverter 130 is further connected through a capacitor 136 to Vcc. The output of inverter 132 is connected through a capacitor 138 to Vcc, and the output of inverter 134 is further connected through a capacitor 140 to Vcc. The output of inverter 130 is further connected to the collector of a transistor 146; the output of inverter 132 is further connected to the collector of a transistor 148 and the output of inverter is 134 is further connected to the collector of a transistor 150. The bases of transistors 146, 148 and 150 are all connected to a fixed Vbb voltage. The emitters of transistors 146, 148 and 150 are all connected to the current control node 120. In this configuration, the transistors 146, 148 and 150 act as a 3-way current splitter such that the current drawn through current control node 120 is drawn equally from the outputs of inverters 130, 132 and 134. The output of CCO 102 is taken from a second inverting output of inverter 132.

The voltage controlled current source 118 consists of a transistor 160 and a resistor 162. The base of transistor 160 is the voltage control input of voltage controlled current source 118, and the collector of transistor 160 is the current output. The emitter of transistor 160 is connected to one side of the resistor 162, the other side of which is connected to ground.

The operation of CCO 102 is in accordance with U.S. Pat. No. 4,565,976 to David L. Campbell and assigned to the assignee of the present invention. U.S. Pat. No. 4,565,976 is hereby incorporated by reference into this specification. CCO 102 includes three separate delay elements, the first one consisting of inverter 130 and capacitor 136, the second consisting of inverter 132 and capacitor 138 and the third consisting of inverter 134 and 140. As explained in the Campbell patent, the junction between the inverter output and the capacitor of each such delay element in effect constitutes a control input to the delay element, since the current level which is drawn from it, for example through a respective current splitting transistor 146, 148 or 150, determines the delay inserted by the delay element. CCO 102 shows three delay elements, but any number of delay elements may be used as long as they generate an odd number of polarity reversals.

The voltage output $V_c$ of master loop oscillator circuit 50 is essentially the same voltage which forms the voltage input to voltage controlled current source 118, since the resistor 114 is very small. Resistor 114 is present merely to reduce the sensitivity of the CCO 102 to noise on capacitor 116. Thus, if $V_c$ is further connected to the voltage control input of another voltage controlled current source elsewhere on the chip, the other voltage controlled current source will draw almost exactly the same current through its current output as voltage controlled current source 118 draws through node 120, if the transistors and resistors of the two current sources are matched. Moreover, if the current output of the other voltage controlled current source is connected to the current control node of another CCO having components matched to those in CCO 102, then the other CCO will oscillate at the same frequency as the CCO 102. $V_c$ therefore acts as an analog voltage indication of the frequency at which CCO 102 oscillates.

Figure 3:
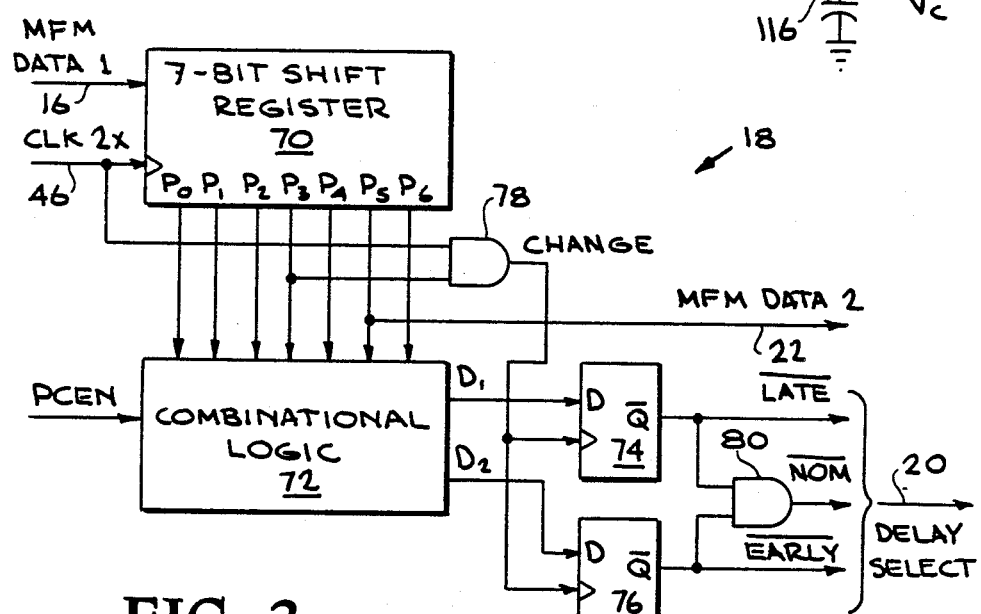
FIG. 3 shows a detail of the Precompensation Select Generator shown in FIG. 1.

The Precompensation Select Generator 18 generates the Delay Selection signal 20 in accordance with the method described in the data sheet for the Advanced Micro Devices Am9581 Floppy/Hard Disk Data Separator integrated circuit, printed in 1985 AMD MOS Microprocessors and Peripherals Data Book, p. 2-561. The Am9581 data sheet is incorporated herein by reference. Other literature which describes aspects of the Am9581 or its replacement, Am9582, are U.S. Pat. No. 4,608,543 to Adams and U.S. Pat. No. 4,628,461 to Adams and Ronald, both of which are incorporated herein by reference. As shown in FIG. 3, the MFMdata-1 signal on line 16 is connected to the serial input of a 7-bit shift register 70. The 7-bit shift register 70 shifts the pulse information from MFMdata-1 through seven pulse positions, numbered $p_0$-$p_6$, in response to the Clk2x signal 46. In the shift register 70, the presence of a pulse on MFMdata-1 line 16 is represented by a logic 1, and the absence of a pulse is represented by a logic 0.

The seven parallel outputs of shift register 70 are connected to inputs of a combinational logic element 72. The PCEN signal also forms an input to combinational logic element 72. Combinational logic element 72 generates two outputs, $D_1$ and $D_2$, according to the formulas $$D_1 = (p_0 p_6 + p_1) p_5 PCEN$$

$$D_2 = (p_0 p_6 + p_5) p_1 PCEN$$

The outputs $D_1$ and $D_2$ are connected to the D inputs of flip flops 74 and 76, respectively. The clock inputs of D flip flops 74 and 76 are connected to the output of an AND gate 78, the inputs of which are connected to the Clk2x signal 46 and the $p_3$ output of shift register 70. The $\overline{Q}$ outputs of D flip flops 74 and 76 constitute the Late and Early components of Delay Selection signal 20. The $\overline{Q}$ outputs of D flip flops 74 and 76 are also NANDed by NAND gate 80 to form the $\overline{Nom}$ component of Delay Selection signal 20. The MFMdata-2 signal 22 is taken from the $p_5$ output of shift register 70.

The Precompensation Select Generator 18 operates by sequentially loading pulse information from the MFMdata-1 line 16 into the shift register 70 in response to Clk2x. The combinational logic element 72 generates the signals $D_1$ and $D_2$, which represent the precompensation appropriate for the information in the center pulse position in the shift register 70, $p_3$. If precompensation is disabled (PCEN=0), both $D_1$ and $D_2$ are forced to 0. If $p_3$ is 1, $D_1$ and $D_2$ are clocked into D flip flops 74 and 76, respectively, on the rising edge of Clk2x. Delay selection signal 20 therefore settles to its appropriate state when the pulse position to which it refers appears at the $p_4$ output of shift register 70. Since MFMdata-2 is taken from the $p_5$ output of shift register 70, the state of Delay Selection signal 20 will always refer to the MFM pulse which will appear on MFMdata-2 line 22 on the immediately subsequent Clk2x cycle.

Figure 4A:
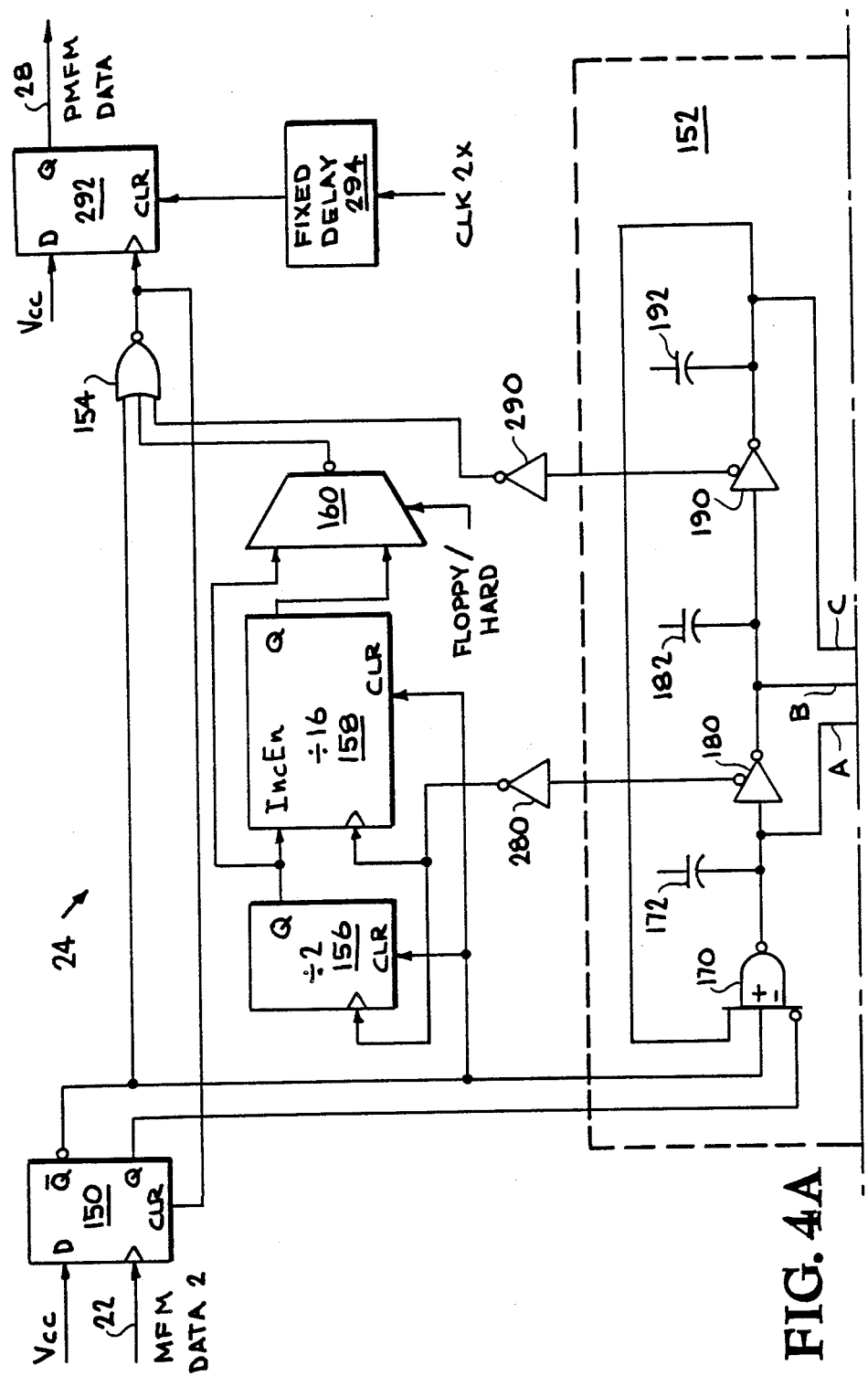
FIGS. 4A and 4B show a detail of the Variable Delay Generator shown in FIG. 1.
Figure 4B:
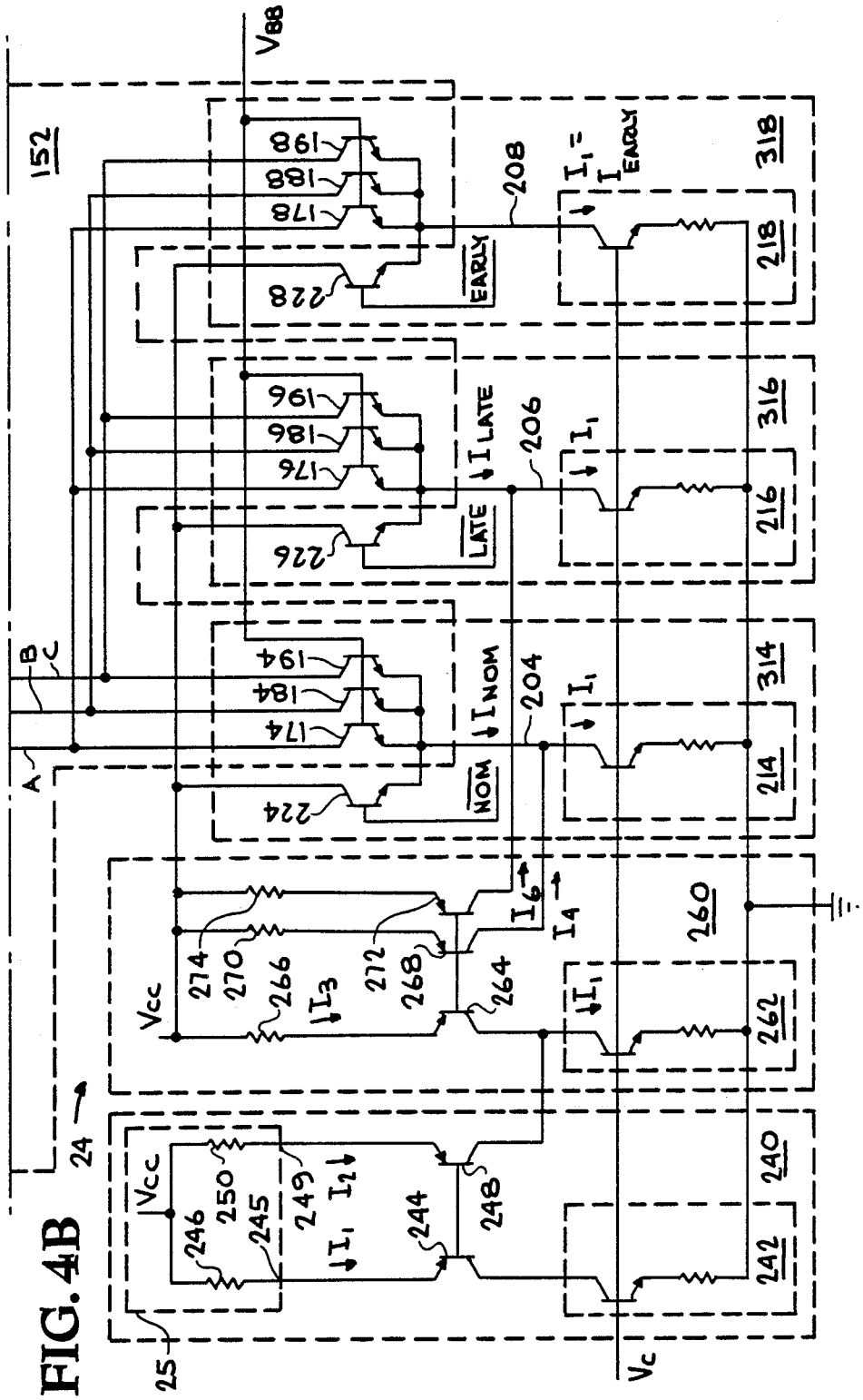

In FIGS. 4A and 4B there is shown a Variable Delay Generator 24 in accordance with the invention and a unit delay period adjustment means 25 which may be used therewith. FIG. 4A adjoins FIG. 4B from the top, and the nodes A, B and C in FIG. 4A are connected to the nodes A, B and C, respectively, in FIG. 4B. All transistors referred to in this description are NPN unless otherwise specified.

Referring to FIG. 4A, the Variable Delay Generator 24 consists of a D flip flop 150, having a D input connected to Vcc and a clock input connected to the MFMdata-2 signal 22. The Q and $\overline{Q}$ outputs of D flip flop 150 are connected to a differential trigger input of a CCO 152. The Q output of flip flop 150 is also connected to a first input of a three-input NOR gate 154 and to the Clr inputs of a divide-by-two counter 156 and a divide-by-sixteen counter 158. The Q output of divide-by-two counter 156 is connected to the increment enable input of divide-by-sixteen counter 158 and also to a first input of a data selector 160. The second input of data selector 160 is connected to the Q output of divide-by-sixteen counter 158, and the inverting output of data selector 160 is connected to a second input of NOR gate 154.

The CCO 152 includes three delay elements but, as previously described with respect to CCO 102 in the master loop oscillator 50, any number of delay elements may be used as long as they result in an odd number of polarity reversals. As shown in FIG. 4A, the CCO 152 consists of a NAND gate 170, having a differential input connected to the trigger input of the CCO 152 and an output connected to the input of an inverter 180. The output of inverter 180 is connected to the input of an inverter 190, the output of which is connected around to a second input of the NAND gate 170. The output of NAND gate 170 is further connected through a capacitor 172 to Vcc and to the collectors of transistors 174, 176 and 178 (see FIG. 4B). The output of inverter 180 is connected through a capacitor 182 to Vcc, and to the collectors of transistors 184, 186 and 188. The output of inverter 190 is further connected through a capacitor 192 to Vcc and to the collectors of transistors 194, 196 and 198. The bases of transistor 174, 176, 178, 184, 186, 188, 194, 196 and 198 are all connected to Vbb such that these nine transistors act as three groups of three current splitters each. The emitters of transistors 174, 184 and 194 are all connected together and connected to a current control node 204. The emitters of transistors 176, 186 and 196 are similarly connected together and connected to a current control node 206. The emitters of transistors 178, 188 and 198 are also connected together and connected to a current control node 208. The current control nodes 204, 206 and 208 are connected to the current outputs of voltage controlled current sources 214, 216 and 218, respectively, the voltage control nodes of which are all connected to $V_c$. The current control nodes 204, 206 and 208 are further connected to the emitters of deactivating or bypass transistors 224, 226 and 228, respectively. The bases of deactivating transistors 224, 226 and 228 are connected to the $\overline{Nom}$, $\overline{Late}$ and $\overline{Early}$ components of the Delay Selection signal 20, respectively, and the collectors are all connected together and to Vcc.

The Variable Delay Generator 24 shown in FIGS. 4A and 4B further includes two current mirrors 240 and 260. The current mirror 240 has an input branch consisting of a voltage controlled current source 242, the current output of which is connected to the collector of a PNP transistor 244, the emitter of which is connected to a terminal 245 of the external unit delay period adjustment means 25. The current mirror 240 further includes an output branch consisting of PNP transistor 248 having its base connected to the base of transistor 244, and having its emitter connected to a terminal 249 of the external unit delay period adjustment means 25. The collector of transistor 248 forms the current output of current mirror 240. As will be explained below, the external unit delay period adjustment means 25 may have many configurations. A typical configuration is that shown in FIG. 4B, in which the terminal 245 is connected through a resistor 246 to Vcc and the terminal 249 is connected through a resistor 250 to Vcc.

The current mirror 260 includes an input branch consisting of a voltage controlled current source 262, the current output of which is connected to the collector of a PNP transistor 264, the emitter of which is connected through a resistor 266 to Vcc. The current mirror 260 further includes two output branches, the first consisting of a PNP transistor 268 having its base connected to the base of transistor 264 and its emitter connected through a resistor 270 to Vcc. The second branch consists of a transistor 272 having its base connected to the bases of transistors 264 and 268 and an emitter connected through a resistor 274 to Vcc. The collectors of transistors 268 and 272 form the first and second output branches, respectively, of current mirror 260. The output of current mirror 240 is connected to the input branch of current mirror 260 at the junction between the voltage controlled current source 262 and the collector of transistor 264. The first and second outputs of current mirror 260 are connected to current control nodes 204 and 206, respectively.

Resistors 246 and 250 in the unit delay period adjustment means 25 are located off-chip and have values which may be chosen by the user. Together they form a means for adjusting the current transfer ratio of current mirror 240, and it will be understood that a more sophisticated, possible dynamically alterable, circuit could be used in place of the two resistors.

The voltage controlled current sources 242 and 262 each consist of an NPN transistor having its emitter connected through a resistor to ground. The base of each such transistor forms the voltage control input of the voltage controlled current sources 242 and 262 and are both connected to $V_c$. The collectors of the transistors form the current outputs of the respective voltage controlled current sources 242 and 262 and are connected as previously described.

Referring again to FIG. 4A, the inverter 180 has a second inverting output which is connected through an inverter 280 to the clock inputs of divide-by-two counter 156 and divide-by-sixteen counter 158. Inverter 190 has a second inverting output which is connected through an inverter 290 to the third input of NOR gate 154. The output of NOR gate 154 is connected back to the Clr input of D flip flop 150 and also to the clock input of a D flip flop 292. The D input of the D flip flop 292 is connected to Vcc, and the Clr input is connected through a fixed delay 294 to the Clk2x signal. The Q output of D flip flop 292 forms the PMFM Data output 28 of the Variable Delay Generator 24.

The operation of Variable Delay Generator 24 as shown in FIGS. 4A and 4B will now be described. When the circuit is at rest, the D flip flop 150 has been cleared such that its Q output is 0 and the $\overline{Q}$ output is 1. The $\overline{Q}$ output of D flip flop 150 is connected to the Clr inputs of divide-by-two counter 156 and divide-by-sixteen counter 158, thereby forcing their Q outputs to 0 regardless of any activity at their clock inputs. Since both inputs to the data selector 160 are 0, its inverting output is 1 regardless of the state of the Floppy/Hard signal. This forces the output of NOR gate 154 to 0 regardless of the states of the other two inputs to the NOR gate. The outputs of D flip flop 150 are connected to the trigger input of CCO 152, which is a differential input to NAND gate 170. Logically, the differential input to NAND gate 170 operates as an ordinary input connected to the Q output of D flip flop 150. Since the Q output of D flip flop 150 is 0, the output of NAND gate 170 is forced to 1, thereby forcing the outputs of inverter 180 to 0 and the outputs of inverter 190 to 1. The 0-level at the second output of inverter 180 is inverted by inverter 280, causing the clock inputs to divide-by-two counter 156 and divide-by-sixteen counter 158 remain at a 1 level.

It can be seen that the output of NOR gate 154 will remain 0 until both the $\overline{Q}$ output of D flip flop 150 and the inverting output of data selector 160 are brought to 0. Further, if the output of inverter 290 is brought to a 1-level before the other two inputs of NOR gate 154 are brought to 0, the output of NOR gate 154 will remain 0 until the output of inverter 290 returns to 0 as well. The clock input of D flip flop 292 therefore remains at a 0 level until this happens. Since the Clk2x signal (as delayed by fixed delay 294) is repeatedly clearing D flip flop 292, the Q output of D flip flop 292, which constitutes the PMFM Data output of the Variable Delay Generator 24, is 0.

When a pulse arrives on the MFMdata-2 line, the D flip flop 150 loads in a 1. The $\overline{Q}$ output goes to 0, thereby ending the continuous clear of divide-by-two counter 156 and divide-by-sixteen counter 158. The first input of NOR gate 154 goes to 0, but the output remains at a 0-level because the second input of NOR gate 154 is still high. At the same time, the Q output of D flip flop 150 goes to 1. Since the second input of NAND gate 170 is also at a 1 level, the output of NAND gate 170 goes to 0. This change the propagates through inverters 180 and 190 at a rate determined by the current level being drawn from the outputs of NAND gate 170, inverter 180 and inverter 190 through the current control nodes 204, 206 and 208, respectively. The operation of CCO 152 is further explained in the aforementioned Campbell patent. The output of inverter 190 eventually changes from 1 to 0 and if the Q output of D flip flop 150 is still set to 1, recirculates and causes the output of NAND gate 170 to return to its 1 level. The outputs of the gates 170, 180 and 190 continue to oscillate in this manner, and at the frequency determined by the current being drawn through the current control nodes 204, 206 and 208, until the Q output of D flip flop 150 returns to 0.

When the effect of the initial trigger edge from the Q output of D flip flop 150 reaches the second inverting output of inverter 180, causing that output to rise to a 1 level, the clock inputs of divide-by-two counter 156 and divide-by-sixteen counter 158 drop from a 1 to a 0 level. This has no effect on the counters since they are rising edge triggered. When the effect of the initial trigger reaches the second output of inverter 190, bringing it to a 0 level, inverter 290 causes the third input of NOR gate 154 to go high. As previously mentioned, this has no effect on the output of NOR gate 154, since the inverting output of data selector 160 is still high. The effect of the initial trigger then propagates around to NAND gate 170 and eventually brings the second output of inverter 180 back to its 0 level. This causes a rising edge at the clock inputs of divide-by-two counter 156 and divide-by-sixteen counter 158. The increment enable input of divide-by-sixteen counter 158 is 0 from the Q output of divide-by-two counter 156 at this time, so that divide-by-sixteen counter 156 does not increment. Divide-by-two counter 156 increments with every rising edge of the clock, so that its Q output is now changed to a 1. If the Floppy/Hard signal is set to Hard, indicating that the chip is being used at the higher rates associated with hard disks, then the data selector 160 passes the inverse of that 1 level, i.e., a 0, to the second input of NOR gate 154. Note that the output of NOR gate 154 is still not immediately affected by this transition, because the third input of NOR gate 154, coming from the output of inverter 290, is still high. However, once the effect of the initial trigger in the CCO 152 reaches the second output of inverter 190, the output of inverter 290 returns to its initial 0 level making all three inputs to NOR gate 154 low and forcing its output high.

It can be seen that the inverting output of data selector 160 acts as a signal which enables or disables the effect which a falling edge at the output of inverter 290 has on the output of NOR gate 154. The effect of the initial trigger of the CCO 152 must therefore propagate through all three gates, 170, 180 and 190, twice before the rising edge of the pulse on the MFMdata-2 line 22 reaches the output of NOR gate 154. Similarly, it can be seen that if the Floppy/Hard signal is set to Floppy, indicating that the chip is operating at the lower data rates of floppy disks, the rising edge of the pulse on MFMdata-2 line 22 does not reach the output of NOR gate 154 until the trigger of CCO 152 has propagated through gates 170,180 and 190 at total of 16 times. When the output of NOR gate 154 finally goes high, D flip flop 150 is cleared, forcing its $\overline{Q}$ output to 1. This then brings the output of NOR gate 154 back to 0, ending the clear operation of D flip flop 150 and readying it for another pulse on MFMdata-2 line 22. The return of the $\overline{Q}$ output of D flip flop 150 to the high level also stops the oscillation of CCO 152 and clears divide-by-two counter 156 and divide-by-sixteen counter 158. The quick pulse exhibited by the output of NOR gate 154 clocks a 1 level into the Q output of D flip flop 292, a level which is cleared after a fixed delay period following the next rising edge in Clk2x.

It can be seen that each pulse entering the Variable Delay Generator 24 on MFMdata-2 line 22 is regenerated on the PMFM Data line 28 after a delay period which is dependent on the oscillation frequency of current controlled oscillator 152. The oscillation frequency of CCO 152 is in turn dependent on the current being drawn off the outputs of NAND gate 170, inverter 180 and inverter 190 by the transistor arrangement shown in FIG. 4B. This will be explained by first referring to the subcircuit 318 consisting of transistors 228, 178, 188 and 198, current control node 208 and voltage controlled current source 218. As has been previously mentioned, the transistors 178, 188 and 198 are biased by Vbb to act as current splitters. This permits the transition time for the outputs of gates 170, 180 and 190 to be dependent on the current level being drawn off them, but isolated from each other.

If deactivation transistor 228 is not conducting, then all the current drawn through node 208 by voltage controlled current source 218 is drawn through the current splitters 178, 188 and 198 off the outputs of gates 170, 180 and 190. Assuming none of the other transistors shown in FIG. 4B are drawing current off of such outputs, the voltage level at the voltage control input of voltage controlled current source 218 is fully determinative of the frequency of operation of CCO 152. It can be seen that the oscillator loop itself and the current splitter transistors 178, 188 and 198, as well as the voltage controlled current source 218 are arranged in the same way as the current controlled oscillator 102 and the voltage controlled current source 118 of the master loop oscillator 50 as shown in FIG. 2. All corresponding components are in fact matched to each other, a feature which is made possible by the fact that they are all located on the same chip. Since the voltage control inputs of both the voltage controlled current sources 118 and 218 are connected to the same voltage level $V_c$, the CCO 152 will oscillate at substantially the same frequency as CCO 102. Referring to the divide-by-four counter 104 in FIG. 2 and the divide-by-sixteen counter 54 in FIG. 1, it can be seen that the period of oscillation of these CCO's is ¼ the bit cell time in hard disk mode and 1/32 the bit cell time in floppy mode. But since the trigger edge propagate through the oscillator loop in CCO 152 twice in hard disk mode and sixteen times in floppy mode, the pulse entering the Variable Delay Generator 24 on MFMdata-2 line 22 is regenerated on PMFM Data line 28 consistently at about half the bit cell time later.

Note that deactivation transistor 228 is not conducting when the $\overline{Early}$ signal is in its low (active) state. When $\overline{Early}$ is high, deactivation transistor 228 conducts and the voltage controlled current source 218 draws through it rather than through the current splitter transistors 178, 188 and 198. The transistor 228 thus serves to effectively deactivate current control node 208 as the control node for CCO 152 when the $\overline{Early}$ signal is inactive.

The subcircuit 316, constituting deactivation transistor 226, diode transistors 176, 186 and 196, current control node 206 and voltage controlled current source 216 operates similarly to the subcircuit 318. Similarly, subcircuit 314, consisting of deactivation transistor 224, diode transistors 174, 184 and 194, current control node 204 and voltage controlled current source 214, also operates in the same way as the subcircuits 318 and 316. However, the current control nodes 206 and 204 have further connected to them the second and first output branches, respectively, of current mirror 260. These output branches provide additional paths for the current which is drawn by the voltage controlled current sources 216 and 214 to bypass the diode transistors. As will be seen, the second current output branch of current mirror 260 provides to current control node 206 a controlled fraction, on the order of 4% to 80% of the current being drawn through that node by voltage controlled current source 216. Similarly, the first output branch of current mirror 260 provides to current control node 204 a different controlled fraction (on the order of 2% to 40%) of the current being drawn through the control node by voltage controlled current source 214. Thus, by activating one of the Delay Selection signals $\overline{Early}$, $\overline{Nom}$ or $\overline{Late}$, or combinations thereof, a different level of current draw from the outputs of gates 170, 180 and 190 may be selected. The different levels of current draw cause the CCO 152 to operate at different frequencies, thereby resulting in a selectable delay period between the time that an MFMdata-2 pulse arrives at the input to the Variable Delay Generator 24 and the time it is regenerated at the PMFM Data output 28. Moreover, since the current levels on the first and second output branches of current mirror 260 are analog signals, each of the these selectable delay periods may be adjusted by a continuous amount.

The current levels on the first and second outputs of current mirror 260 are given by, respectively, $$I_4 = (I_1 - I_2)(R_{266}/R_{270})$$

$$I_6 = (I_1 - I_2)(R_{266}/R_{274}),$$

where $I_1$ is the current drawn by voltage controlled current source 262 and $I_2$ is the current output of current mirror 240. $R_{270}$ is set equal to $R_{266}$ and $R_{274}$ is set to two-thirds of $R_{266}$, thereby fixing the current level $I_6$ injected into node 206 at 1.5 times the current level $I_4$ injected into node 204. The figure of 1.5 was chosen to compensate for nonlinearities in the current-to-time delay relationship of CCO 152. This guarantees that, if the Nominal precompensation delay period is considered to be one unit delay greater than the Early delay period, then the Late precompensation delay period will be two units delays greater than the Early delay period. It can be seen that additional output branches may be added to current mirror 260 and connected to other current control nodes of the CCO 152 to provide other delay period selection choices, and that various current transfer ratios to the output branches may be chosen to compensate for various nonlinearities in the system.

The current output $I_2$ of current mirror 240 is a function of the external resistors in the unit delay period adjustment means 25, as follows:

$$I_2 = I_1(R_{246}/R_{250}).$$

$I_1$ in this formula is the same as $I_1$ in the formulas for current mirror 260 because the components in the voltage controlled current source 242 are matched to the corresponding components in voltage controlled current source 262, and because the voltage control node of each is connected to $V_c$. Substituting for $I_2$ in the equations for current mirror 260, it can be seen that $$I_4 = I_1(1 - R_{246}/R_{250})$$

$$I_6 = (1.5)I_1(1 - R_{246}/R_{250}).$$

Since the components in voltage controlled current sources 214, 216 and 218 are all matched to those in voltage controlled current sources 242 and 262 (and 118 as well), the current levels they draw from their respective current control nodes 204, 206 and 208 are all equal to $I_1$. Thus, the current which passes from CCO 152 to node 204 when node 204 is activated by transistor 224 is $$I_{Nom} = I_1(R_{246}/R_{250}).$$

Similarly, the current which passes from CCO 152 to node 206 when node 206 is activated by transistor 226 is $$I_{Late} = (1.5)I_1(R_{246}/R_{250}).$$

No additional current is being injected into node 208, so the current which passes from CCO 152 to node 208 when node 208 is activated by transistor 228 is $$I_{Early} = I_1.$$

Thus it can be seen that not only can 0, 1 or 2 unit delay periods (beyond the basic delay period caused by $I_1$) be selected, but the unit delay period may itself be adjusted continuously through the choice of the external resistors $R_{246}$ and $R_{250}$. Moreover, the choice of these resistors sets the unit delay period as a function of the bit cell time, not some absolute time period. This is true because $I_{Early}$, $I_{Nom}$ and $I_{Late}$ are all functions of $I_1$. $I_1$ is the same current level which is drawn from CCO 102 through current control node 120 in the bit rate oscillator 50 (see FIG. 2), and since the components in CCO 102 are matched to the corresponding components in CCO 152, any change in the period of oscillation of bit rate oscillator 50 will cause a corresponding change in the basic time delay which $I_1$ causes in CCO 152.

Current mirror 260 is not essential in the circuit of FIG. 4B; current mirror 240 may instead be given a second output branch and the two output branches connected directly to current control nodes 204 and 206. The inclusion of current mirror 260 does, however, provide two advantages. First, a second output branch in current mirror 240 might necessitate the use of an additional external resistor in the current transfer ratio adjustment means 25. This would be a detriment since it is desirable to minimize the number of external components needed to operate the chip. Current mirror 260 provides one method of creating the second output branch while avoiding the additional external resistor Second, the desirable unit precompensation delay periods fall into the range of about 1% to 20% of the bit cell time. Since the basic delay period caused by $I_1$ is half the bit cell time (as explained above), it can be seen that the desired range for the ratio $I_2/I_1$ would be 2% to 40% if the output branch of current mirror 240 was connected directly to a current control node such as 204. This would cause inaccuracies in the operation of the current mirror because the accuracy of this type of current mirror depends on the approximation that $V_{BE244} \approx V_{BE248}$. This approximation would no longer hold. The inclusion of current mirror 260 alleviates this problem since the desired range for $I_2/I_1$ becomes 60% to 98%, percentages which do not seriously degrade the accuracy of current mirror 240.

The invention has been described with respect to particular embodiments thereof, and numerous variations will be apparent to the person of ordinary skill. For example, the current injected into control node 204 or 206 (or into the terminal 249 in current mirror 240) may be generated by methods other than that described herein, such as by a dynamically variable current source. As another example, other ways may be used to couple the adjusted or unadjusted current outputs of voltage controlled current sources 214, 216 and/or 218 to the control inputs of the delay elements in CCO 152. As yet another example, though the transistors used in the above description are bipolar, another circuit may be devised using MOS transistors or other types of switches. These and many other modifications and improvements are within the scope of the invention.

I claim:

1. Apparatus for generating a delay in the path of a data signal, for use in association with a delay selection signal (20), comprising:

at least a first (208) and a second (204) delay control node;

controlled delay means (FIG. 4A) inserted in the path of the data signal and having a controlled delay means current control port (A,B,C) coupled to an activated one (208 or 204) of the delay control nodes, a current level passing between the controlled delay means current control port and the activated one of the delay control nodes, the controlled delay means being for generating a delay having a duration responsive to the current level; and node activation means (228, 224) coupled to the delay control nodes for activating one of the delay control nodes in response to the state of the delay section signal.

2. Apparatus according to claim 1, further comprising means coupled to the second delay control node for adjusting by a substantially continuous amount of the current level which passes between the controlled delay means current control port and the second delay control node when the second delay control node is activated.

3. Apparatus according to claim 1, wherein the second delay control node and the controlled delay means are both located on a single chip, further comprising means coupled to the second delay control node for adjusting, by an amount which is adjustable externally to the single chip, the current level which passes between the controlled delay means current control port and the second delay control node when the second delay control node is activated.

4. Apparatus according to claim 3, wherein the data signal has a bit cell time and wherein the means for adjusting is such that the current level passing between the controlled delay means current control port and the second delay control node is adjustable as a function of the bit cell time.

5. Apparatus according to claim 1, wherein the second delay control node and the controlled delay means are both located on a single chip, further comprising:

master oscillator means (50) for generating a clock signal (MFMHClk) having a master oscillator clock period, and means ($V_c$, 25, 240, 260, 214) coupled to the second delay control node and coupled to receive a signal indicative of the master oscillator clock period, for adjusting the current level passing between the controlled delay means current control port and the second delay control node such that the duration of the delay is adjustable externally to the single chip as a function of the master oscillator clock period.

6. Apparatus according to claim 1, wherein the second delay control node and the controlled delay means are both located on a single chip, further comprising:

a master oscillator control node (120);

master oscillator means (102) located on the single chip, having a master oscillator current control port coupled to the master oscillator control node, a current level passing between the master oscillator current control port and the master oscillator current control node, the master oscillator means being for generating a clock signal having a master oscillator clock period responsive to the current level passing between the master oscillator current control port and the master oscillator control node; and means ($V_c$, 240, 260, 214) located on the single chip, coupled to the second delay control node and coupled to receive a signal indicative of the master oscillator clock period, for adjusting the current level passing between the controlled delay means current control port and the second delay control node by an amount which is adjustable (25) externally to the single chip as a substantially linear function of the current level passing between the master oscillator current control port and the master oscillator control node.

7. Apparatus for delaying a data signal having a bit cell time, for use in association with a delay selection signal (20) and a reference clock signal (52), the reference clock signal having a frequency indicative of the bit cell time, comprising:

a frequency to reference signal converter (50) having an output ($V_c$) and having an input (52) coupled to the reference clock signal; and a variable delay generator (24) having a main control input (26) coupled to the output of the frequency to reference signal converter, and generating a delay period which is a predetermined function of the reference signal at the main control input, the variable delay generator comprising means (228, 224) coupled to receive the delay selection signal, for selecting the predetermined function from at least a first and second function in response to the delay selection signal.

8. Apparatus according to claim 7, for use in further association with a unit delay period adjustment means, wherein the delay period resulting from the second function is proportional by a constant of proportionality to the delay period resulting from the first function, the variable delay generator further comprising means for adjusting the constant of proportionality in response to the unit delay period adjustment means.

9. Apparatus according to claim 8, wherein the reference signal is a voltage signal, wherein the variable delay generator further comprises:

a delay generator current controlled delay element (190, 192) having a time delay characteristic and a delay element control input (C); and first (218) and second (214) voltage controlled current sources, each having a current output (208, 204) and each having a voltage control input ($V_c$) coupled to the main control input of the variable delay generator, the first and second voltage controlled current sources having V-I characteristics which are substantially matched;

wherein the means for adjusting the constant of proportionality comprises means (240, 260, 268, $L_4$) for adjusting the current output of the second voltage controlled current source in response to the unit delay period adjustment means; and wherein the means for selecting the predetermined function comprises means (198, 228, 194, 224) for coupling the current output of the first and/or the second voltage controlled current source to the delay element control input in response to the delay selection signal.

10. Apparatus according to claim 9, wherein the means for coupling comprises:

a first transistor (198) connected between the delay element control input and the current output of the first voltage controlled current source;

a second transistor (194) connected between the delay element control input and the current output of the second voltage controlled current source;

a first deactivation switch (228) having a first current path terminal connected to the current output of the first voltage controlled current source and a control terminal coupled to the delay selection signal such as to open or close in response to the delay selection signal a route for substantially all the current flow generated by the first voltage controlled current source to bypass the delay element control input; and a second deactivation switch (224) having a first current path terminal connected to the current output of the second voltage controlled current source and a control terminal coupled to the delay selection signal such as to open or close in response to the delay selection signal a route for substantially all the current flow generated by the second voltage controlled current source to bypass the delay element control input.

11. Apparatus according to claim 9, wherein the means for adjusting the current output of the second voltage controlled current source comprises a first current mirror (240) couplable to the unit delay period adjustment means, the first current mirror having an input branch ($I_1$) and an output branch ($I_2$), the input branch including a voltage controlled current source (242) with a voltage control input ($V_c$) coupled to the main control input of the variable delay generator, the voltage controlled current source in the input branch of the first current mirror having a V-I characteristic which is substantially matched to the V-I characteristic of the second voltage controlled current source, the output branch of the first current mirror being coupled (260, $L_4$) to the current output of the second voltage controlled current source to thereby reduce or increase the current flow generated by the second voltage controlled current source.

12. Apparatus according to claim 11, further comprising a second current mirror having an input branch and an output branch, the input branch of the second current mirror including a voltage controlled current source with a current output and with a voltage control input coupled to the main control input of the variable delay generator, the voltage controlled current source in the input branch of the second current mirror having a V-I characteristic which is substantially matched to the V-I characteristic of the voltage controlled current source in the input branch of the first current mirror, the second current mirror being coupled between the first current mirror and the current output of the second voltage controlled current source such that the output branch of the first current mirror is coupled to the current output of the voltage controlled current source in the input branch of the second current mirror, and the output branch of the second current mirror is coupled to the current output of the second voltage controlled current source.

13. Apparatus according to claim 11, wherein the variable delay generator further comprises:
a third voltage controlled current source (216) having a current output and having a voltage control input coupled to the main control input of the variable delay generator, the third voltage controlled current source having a V-I characteristic which is substantially matched to the V-I characteristic of the first voltage controlled current source; and
means (240, 260, 272, I₆) for adjusting the current output of the third voltage controlled current source in response to the unit delay period adjustment means;
wherein the means for coupling the current output of the first and/or second voltage controlled current source comprises means (198, 228, 194, 224, 196, 226) for coupling the current output of the first, second and/or third voltage controlled current source to the delay element control input in response to the delay selection signal.

14. Apparatus according to claim 11, wherein the frequency to reference signal converter includes a phase locked loop comprising:
an input (52) coupled to the input of the frequency to reference signal converter;
a current controlled oscillator (102) having a current control input (120); and
an oscillator voltage controlled current source (118) having a voltage control input coupled to the output (V_c) of the frequency to voltage converter and having a current output coupled to the current control input of the current controlled oscillator, the oscillator voltage controlled current source having a V-I characteristic substantially matched to the V-I characteristic of the voltage controlled current source in the input branch of the first current mirror,
the current controlled oscillator including an oscillator current controlled delay element (134, 140) having a time delay characteristic which is matched to the time delay characteristic of the delay generator current controlled delay element.

15. An integrated circuit for generating a precompensation delay in the path of a data signal having a bit cell time, for use in association with a unit delay period adjustment means (25) external to the integrated circuit and with a delay section signal (20), comprising:

a master voltage controlled oscillator (102, 118) including:
a master current controlled time delay element (134, 140, 132, 138, 130, 136, 150, 148, 146) having an input, an output coupled to the input, a master current control node (120) and a master current-to-time-delay relationship; and
a master voltage controlled current source (118) having a master voltage control node and having a current output coupled to the master current control node;
means (104, 106, 108, 110, 112, 114, 116) for applying to the master voltage controlled current source a control voltage signal ($V_c$) such that the master voltage controlled oscillator operates with a period having a known relationship to the bit cell time, the current output of the master voltage controlled current source being related to the control voltage signal by a master voltage-to-current relationship;
a secondary current controlled time delay element (190, 192, 180, 182, 170, 172) having an input, an output, a secondary current control port (208, 206, 204) and a secondary current-to-time-delay relationship, the secondary current-to-time-delay relationship being substantially the same as the master current-to-time-delay relationship;
a first voltage controlled current source (218) having a current output coupled to the secondary current control port, the current output of the first voltage controlled current source being related to the control voltage signal by a first voltage-to-current relationship, the first voltage-to-current relationship being substantially the same as the master voltage-to-current relationship;
a second voltage controlled current source (214) having a current output coupled to the secondary current control port, the current output of the second voltage controlled current source being related to the control voltage signal by a second voltage-to-current relationship, the second voltage-to-current relationship being substantially the same as the master voltage-to-current relationship;
a third voltage controlled current source (216) having a current output coupled to the secondary current control port, the current output of the third voltage controlled current source being related to the control voltage signal by a third voltage-to-current relationship, the third voltage-to-current relationship being substantially the same as the master voltage-to-current relationship;
means (198, 194, 196, 188, 184, 186; 178, 174, 176) for avoiding interaction between the current outputs of the first, second and third voltage controlled current sources;
means (228, 224, 226) for decoupling the current output of at least one of the first, second and third voltage controlled current sources from the secondary current control port in response to the delay selection signal;
a first current mirror (260) having an input branch ($I_3$) and first ($I_4$) and second ($I_6$) output branches and having a current transfer ratio to the first output branch different from the current transfer ratio to the second output branch, the first output branch being coupled to the current output of the third voltage controlled current source to thereby alter the current flow generated by the third voltage controlled current source, the second output branch being coupled to the current output of the second voltage controlled current source to thereby alter the current flow generated by the second voltage controlled current source;

a first additional voltage controlled current source (262) having a current output coupled to the input branch of the first current mirror, the current output of the first additional voltage controlled current source being related to the control voltage signal by a first additional voltage-to-current relationship, the first additional voltage-to-current relationship being substantially the same as the master voltage-to-current relationship;

an adjustable current transfer ratio current mirror (240) having an input branch ($I_1$) and an output branch ($I_2$) and a current transfer ratio adjustment input (245, 249), the output branch of the adjustable current transfer ratio current mirror being coupled to the output of the first additional voltage controlled current source to thereby alter the current flow generated by the first additional voltage controlled current source; and a second additional voltage controlled current source (242) having a current output coupled to the input branch of the adjustable current transfer ratio current mirror, the current output of the second additional voltage controlled current source being related to the control voltage signal by a second additional voltage-to-current relationship, the second additional voltage-to-current relationship being substantially the same as the master voltage-to-current relationship;

the current transfer ratio adjustment input being couplable to the unit delay period adjustment means.

16. An integrated circuit in accordance with claim 15, further comprising a power node, and wherein the means for decoupling the current output of the first, second and/or third voltage controlled current source from the secondary current control port comprises:

a first bypass switch coupled between the current output of the first voltage controlled current source and the power node;

a second bypass switch coupled between the current output of the second voltage controlled current source and the power node; and a third bypass switch coupled between the current output of the third voltage controlled current source and the power node, the first, second and third bypass switches each having a control terminal coupled to the delay selection signal.

17. Apparatus for delaying a data signal, for use in association with a delay selection signal, comprising:

first and second delay control means;

controlled delay means inserted in the path of the data signal for generating a delay having a duration responsive to an activated one of the first and second delay control means; and means for activating one of the delay control means in response to the delay selection signal.

* * * * *